United States Patent [19]

Cates et al.

[11] 3,769,693

[45] Nov. 6, 1973

[54] PROCESS FOR PREPARING NUCLEAR HARDENED SEMICONDUCTOR AND MICROELECTRONIC DEVICES

[75] Inventors: Harold T. Cates; Ray E. Darling, both of Orlando, Fla.

[73] Assignee: Martin-Marietta Corporation, New York, N.Y.

[22] Filed: July 16, 1971

[21] Appl. No.: 163,457

[52] U.S. Cl. .................................... 29/574, 148/1.5

[51] Int. Cl. .................................... B01j 17/00

[58] Field of Search .............................. 29/574, 576; 148/1.5; 204/157.1 H; 317/235, 48.9

[56] References Cited

UNITED STATES PATENTS

| | | | |
|---|---|---|---|
| 3,015,762 | 1/1962 | Shockley | 317/234 |
| 3,464,790 | 9/1969 | Schrader et al. | 204/157.1 H |
| 3,660,171 | 5/1972 | Tsuchimoto et al. | 148/1.5 |
| 3,667,116 | 6/1972 | Felice | 29/574 |

*Primary Examiner*—Charles W. Lanham
*Assistant Examiner*—W. Tupman
*Attorney*—Julian C. Renfro

[57] ABSTRACT

A process for preparing nuclear hardened semiconductor or microelectronic devices comprising:

1. determining the electrical characteristics of semiconductor or microelectronic devices;
2. designating the electrically acceptable semi-conductor or microelectronic devices;
3. exposing said acceptable semiconductor or micro-electronic devices to a neutron environment;
4. determining the electrical characteristics of said exposed semiconductor or microelectronic devices; and
5. annealing the neutron environment electrically acceptable semiconductor or microelectronic devices is disclosed.

5 Claims, No Drawings

PROCESS FOR PREPARING NUCLEAR HARDENED SEMICONDUCTOR AND MICROELECTRONIC DEVICES

BACKGROUND OF THE INVENTION

1. Field of the Invention

This invention relates to a novel process for preparing semiconductor and microelectronic devices which are nuclear hardened. More particularly, this invention relates to a process in which semiconductor or microelectronic devices are electrically tested, are subjected to neutron bombardment, subsequently electrically tested to determine the acceptability of the semiconductor or microelectronic devices in the neutron environment, followed by an annealing to obtain semiconductor or microelectronic devices which have the appropriate degree of nuclear hardness.

2. Description of the Prior Art

Many electronic systems employing semiconductors or microelectronic devices such as those used in nuclear power plants, missiles, nuclear generator systems, nuclear propulsion systems and space applications are required to function during or after an exposure to a nuclear radiation environment. In particular, bipolar transistors and related integrated circuits are very sensitive to the effects of neutron damage. These effects may result in post-irradiation circuit failure of the electronic systems at neutron fluences below the radiation level desired for operation.

With conventional semiconductor processing discrete semiconductor dice are electrically probed or evaluated while still in the wafer form. A wafer will normally contain thousands of discrete semiconductor dice. In such processing, a drop of ink is automatically placed on each electrically unacceptable dice on the wafer. Following a subsequent wafer scribe and break process, the electrically acceptable dice are separated. The dice are then appropriately mounted, connected and packaged so as to thus create a transistor or other such microelectronic device.

Unfortunately, it has not been possible to ascertain using conventional techniques if inherently nuclear defective semiconductor devices were being packaged or utilized. Furthermore, conventional approaches for attempting to predetermine the inherent nuclear hardness of final packaged devices using electrical measurement results are inadequate. Such prior techniques used various electrical measurements to predict those semiconductor dice or devices which would be expected to perform acceptably in neutron environments. Such testing does not eliminate all nuclear unacceptable devices.

Electronic systems are often required to function during and/or after exposure to a nuclear environment. Thus, with prior techniques it is necessary to predict the maximum radiation-induced changes in the electrical parameters of such electronic devices based on the supposed changes in electrical parameters under the stress of a neutron environment. The electrical parameters of semiconductor devices such as transistors and monolithic integrated circuits are particularly sensitive to the effects of both ionization and displacement radiation effects and prediction that the electrical characteristics will be acceptable in a neutron environment is difficult.

It is an object of this invention to provide a process for the preparation of nuclear hardened semiconductors and related microelectronic devices.

It is another object of this invention to provide a procedure whereby nuclear defective semiconductor and microelectronic devices can be identified and thus subsequently isolated and eliminated before subsequent utilization of the devices in electronic applications which are to be subjected to neutron environments.

It is also an object of this invention to provide a method whereby a predetermined assurance of the nuclear hardness of each semiconductor device or microelectronic device can be obtained.

It is also an object of this invention to provide a screening process which assures post-irradiation electrical performance of semiconductors, eliminating the problems associated with individual electrically unacceptable or unpredictable semiconductors.

It is another object of this invention to provide a method of screening transistors and integrated circuits at the wafer stage or early in the manufacturing process by a process which assures electrically acceptable post-neutron-irradiation performance.

It is also an object of this invention to provide a process whereby the manufacturing process for the preparation of semiconductors and related integrated circuits can be monitored as well as a determination made of the effects of manufacturing process changes.

SUMMARY OF THE INVENTION

The above objects of this invention are attained by the process described herein. This process for preparing electrically acceptable nuclear hardened semiconductors and related microelectronic devices which can operate both in a neutron environment and after neutron exposure comprises:

1. in a first operation, electrically testing microelectronic devices or the individual dice of a semiconductor wafer to ascertain for the use desired the electrical acceptability of each microelectronic device or the individual dice of the semiconductor wafer;

2. indicating the electrically acceptable microelectronic devices or individual dice of said semiconductor wafer;

3. exposing the electrically acceptable devices or individual dice of the semiconductor wafer to the maximum neutron environment under which the electrically acceptable devices or dice of said wafer might be expected to be exposed;

4. in a second operation, electrically testing said exposed devices or individual dice in said wafer to ascertain for the use desired the electrical acceptability of each exposed microelectronic device of the individual dice of the semiconductor; and 5. annealing the neutron environment electrically acceptable microelectronic devices or individual semiconductor dice at a temperature ranging from about 225° C to about 700° C.

DETAILED DESCRIPTION OF THE INVENTION

The semiconductors which can be subjected to the process of this invention are any of the known semiconductors such as silicon, germanium, and gallium arsenide semiconductors and devices utilizing piece parts of semiconductors such as silicon, germanium, and gallium arsenide. They can be prepared by conventional techniques and, if desired, they can be doped with conventionally known dopants, coated with oxide layers or epitaxially deposited layers, the construction and composition of the semiconductor being dependent upon the application and use of the semiconductor or device desired. They can be subjected to the process of this invention in the wafer stage or as partially or completely assembled discrete devices. Suitably, transistors, diodes, power triodes, thyristors, power cells, Zenner diodes, semiconductor chips, silicon control rectifiers, hybrid or monolithic integrated circuits can be subjected to the process of this invention to prepare nuclear hardened semiconductor and microelectronic devices. The term nuclear hardened is intended to convey that the device performs for the use intended and in the application desired in a neutron environment, either during bombardment with neutrons or after exposure to the neutron environment.

In the first step of the process of this invention the electrical characteristics of the semiconductor, either in the wafer form, partially or completely assembled, are determined. The electrical characteristics are used to determine for the application or use desired whether the device is acceptable electrically. The electrical characteristics which are measured will be dependent upon the application to which the device will be ultimately subjected, for example, measurement of the saturation voltage, leakage current, breakdown voltage, current gain, forward voltage drop at a specific current and the like can provide the information desired on the electrical characteristics. Determination of one or more of these electrical parameters can be utilized if needed. These electrical parameters are all well known and methods of their determination are well known in the art. The specific measurement is not important but the important criterion is that the appropriate measurement be made of the semiconductor or microelectronic device to enable one to confirm that in the ultimate use or application the device will be electrically acceptable or will be operative for that use or application.

In the next step of the process of this invention, the electrically acceptable semiconductors or microelectronic devices are utilized in subsequent steps of the process, the electrically unacceptable ones being discarded or ignored. For example, where a semiconductor wafer is being subjected to the process and for cost or convenience reasons the electrically unacceptable dice of the discrete wafer, along with the electrically acceptable dice of interest, will continue to be subjected to the remaining process steps yet ultimately not used because of their lack of electrical performance capability of acceptability. Similarly, where continuous processing of assembled devices is used and the process of this invention is being performed in a continuous manner as a part of the semiconductor or microelectronic device manufacturing process with the devices being continuously subjected to the process steps of this invention, those found to be unacceptable may be subjected to subsequent processing from a cost or convenience standpoint and yet ultimately elminated or discarded. It will be apparent that although the electrically unacceptable dice or assembled devices may be continued to be processed in this step or in the subsequent step described hereinafter in which the electrical characteristics of the neutron exposed devices are determined, utlimately the electrically unacceptable will be eliminated or discarded from use in applications requiring nuclear hardness.

The semiconductors or microelectronic devices are next subjected to bombardment with neutrons, for example, by placing the semiconductor or microelectronic device in a neutron environment such as a reactor or other neutron source. The exposure of the neutron source will be dependent upon the neutron fluence to which the semiconductors or microelectronic devices are designed to withstand and be operative for the purposes and applications desired. For example, subjection can be to the maximum neutron fluence to which the semiconductor or microelectronic device might be expected to be subjected during operation. The process of this invention is applicable to neutron fluences ranging from very small to $10^{16} n/cm^2$. The neutron fluence used in this step will be dependent upon the expected neutron environment to which the semiconductors or microelectronics might be expected to be subjected.

The next step of the process of this invention comprises determining the electrical characteristics of the exposed irradiated semiconductors or microelectronic devices. The electrical testing is of the electrical parameters of interest, duplicating those electrical parameters determined in the first step of the process of this invention. The electrical parameter measurements are made in this step to determine those semiconductors or microelectronic devices which continue to have electrically acceptable characteristics, even though due to the neutron exposure the electrical characteristics of interest may be markedly reduced or different, yet still sufficient that the semiconductors or microelectronic devices will be operative during or after exposure to the neutron environment.

The next step of the process of this invention comprises an anneal or heating step in which the exposed semiconductors or microelectronic devices are subjected to a temperature of from about 225° C to about 700° C, preferably from about 400° C to about 550° C. The annealing step can be for a period ranging from about 10 minutes to about 24 hours. The period of time of annealing will, of course, be dependent upon the temperature of annealing and the amount of damage to the semiconductor or microelectronic device. A temperature of less than about 225° C does not provide sufficient thermal energy to the semiconductor or microelectronic device for restoration to the pre-irradiated condition and temperatures higher than about 700° C can cause damage to the semiconductor or microelectronic device.

Thus, by the process described above, those semiconductor or microelectronic devices which are nuclear hardened can be determined by direct evaluation using a nuclear environment. In accordance with the process, nuclear defective semiconductors can be eliminated from possible use in accordance with the above-described process which would not have been eliminated using conventional testing procedures and technology. In accordance with the above process, the specific neutron hardness of each semiconductor dice on a wafer or each microelectronic device can be determined and thus any which are defective eliminated.

While not being bound by theory, it is believed that the effect of neutron bombardment affecting semiconductor materials is the displacement of atoms from their orderly positions in the crystal lattice. The most pronounced result of neutron displacement damage in semiconductors is a reduction of excess minority carrier lifetime. The next most sensitive effect is the reduction of majority carrier concentration, followed by a reduction of carrier mobilities. The net effect is that minority carrier devices such as bipolar transistors and associated monolithic integrated circuits are among the most sensitive devices to displacement effects at normal operating temperatures. For example, a bipolar transistor will experience a decrease in current gain and an increase in collector resistance which results in an increase in the collector-emitter saturation voltage. The degree of sensitivity of bipolar transistors depends upon the design of the particular device with power transistors being intrinsically the most sensitive.

Semiconductors suffer displacement damage to their electrical characteristics when they are exposed to a neutron environment. The magnitude of the damage effect is dependent upon the spectrum and fluence of the incident neutrons. Neutrons cause the crystal atoms of the semiconductor material to be displaced from their normal position in the semiconductor crystal lattice locations. This results in unoccupied lattice positions or vacancies. A displaced atom usually comes to rest in a position out of the lattice structure a short distance from the vacated site and giving rise to what is generally termed an interstitial atom. A primary recoiling atom resulting from a neutron collision may also have sufficient energy to create a large number or a cluster of secondary interstitial and vacancy effects.

The energy transferred on bombardment to a lattice atom has a wide range of values which is dependent upon the neutron scattering angle and the energy of the incident neutron. Therefore, the actual number of secondary displacements in a cluster will vary. However, in each displacement, a vacancy-interstitial pair is created. Eventually, all recoil atoms displaced to interstitial positions will come to thermal equilibrium with the lattice structure unless some accidentally fall into vacancies. Some of the simple defects and defect clusters migrate through the crystal due to the thermal energy of the crystal. These mobile defects become annihilated by recombination of vacancy-interstitial pairs, move to a free surface, or develop immobile stable deflect complexes with other impurities or lattice defects.

The defects can be characterized as simple defects or defect clusters. The simple defects are composed of a few atoms associated together to form a relatively stable defect, whereas the defect cluster involves a large disordered region of up to several hundred atoms. Neutrons usually create defect clusters as a result of large kinetic energy transferred to silicon atoms during primary collisions. Other effects such as thermal spikes and transmutation of the crystal atoms have a higher order effect on the semiconductor electrical characteristics and generally are considered negligible.

Vacancy and interstitial defects give rise to new energy levels in the forbidden energy gap of the crystal, which act as recombination centers to reduce the lifetime of minority carriers. The number of defects produced by neutrons is proportional to the neutron fluence. The actual amount of radiation damage is a function of the type of doping impurity, the device material, the quality and purity of the crystal, the dopant concentration, the temperature, the injection level, the radiation spectrum and the like. Defects also act to decrease the net impurity concentration by introducing trapping centers for the majority carriers and cause the resistivity of the semiconductor material to increase. Other effects, such as a decrease in mobility are small compared with changes in excess minority carrier recombination rate and majority carrier concentration.

Although much is known about crystal defects, it is difficult to precisely and repeatably predict the effects of neutron damage in different production lots. There are many uncontrollable factors that make prediction difficult. Some of these are related to crystalline perfection, uncontrolled impurities in the starting material and process control. Nuclear effect data may also be in error or at least difficult to correlate due to inadequate dosimetry and radiation spectrum data. By the process of this invention, exposure to a neutron environment and use of the electrically acceptable semiconductors, the necessity to predict performance is eliminated.

The process of this invention allows 100 percent semiconductor nuclear acceptance based on values of pre-irradiation electrical parameters, such as beta and gain band width product. For integrated circuits, these electrical parameters can be measured on special test samples or "break-out" transistors or elements that have been fabricated on wafers or integrated circuit chips. Integrated circuit nuclear acceptability is established in this manner. The approach is based on the assumption that the starting wafer material is uniform and that it is possible to produce identical transistors throughout an integrated circuit that degrade in the same amount. This method of semiconductor integrated circuit nuclear acceptance is based on correlation and sample testing only. In one embodiment of this invention, each piece part is exposed to the required nuclear level, 100 percent electrically screened for rejects, and then the nuclear damage thermally annealed out. Verification of the screening effectiveness can be obtained by performing a sample nuclear test to determine whether piece part electrical parameter designation is equivalent to that observed after complete screening.

In accordance with another embodiment of the process of this invention, the surface of a silicon wafer is scribed or otherwise marked in a conventional manner, after which an electrical probe is applied to each dice in order to ascertain whether the dice probed possess the desired electrical characteristics or is defective. In accordance with conventional techniques, a drop of ink or other substance is automatically applied to the electrically unacceptable dice, whereby the electrically acceptable dice are thus indicated. After a complete test of the dice of the wafer, a certain percent of the surface may bear some indication thereon of the defective components contained therein.

After the electrically defective components have been identified, the entire silicon wafer is then placed in a reactor or other neutron source so as to cause a bombardment of all of the dice in the silicon wafer. This procedure results in the electrical degradation of the individual dice of the wafer by causing displacement of some atoms from their orderly positions in the crystal lattice. Those dice which are electrically unacceptable will be degraded to a greater extent than the electrically acceptable dice.

After irradiation with the neutron bombardment, the irradiated wafer is again tested, using the electrical probe so as to identify those dice which have been degraded to a geater extent or an unacceptable level due to the irradiation from the nuclear source than is the acceptable limit. Such electrical testing is again in accordance with known techniques in which a drop of ink or another substance is automatically applied to the electrically unacceptable dice on the irradiated wafer. After identifying the electrically unacceptable dice, the wafer is then scribed and broken into individual dice.

The acceptable dice are then subjected to conventional semiconductor assembly and semiconductor device manufacturing techniques. During this normal processing, each device is subjected to heating or annealing. This heating or annealing causes the displaced atoms in the crystal lattice to be restored to their original orderly positions which in turn results in the restoration of the semiconductor to its original electrical performance capability.

EXAMPLES

Transistor wafers similar to commercially available type 2N2949 were chosen for use. This transistor type was a planar epitaxial gold-doped device with a base width of approximately 1.3 microns. The emitter diffusion depth was between 1.62 and 1.89 microns with an emitter sheet resistivity of 2.5 to 3.0 ohms/square. The base is diffused to a depth between 2.9 and 3.2 microns with a base sheet resistivity of 140 to 170 ohms/square. The collector $n+$ region resistivity was typically 0.015 ohms-cm and between 9.0 and 11.5 microns thick.

Typical electrical characteristics of these devices were as follows:

$I_{CBO}$=350 $n$A at $V_{CB}$=50 Vdc $BV_{CEO}$ (sus.) = 40 Vdc minimum at $I_C$ = 10 to 250 mAdc $h_{FE}$(min.) = 30 at $V_{CE}$ = 1.0 Vdc and $I_C$ = 10 mAdc $h_{FE}$(typical) = 35 to 150 at $V_{CE}$ = 1.0 Vdc and $I_C$ = 100 mAdc $h_{FE}$(min.) = 1.75 when $V_{CE}$ = 10 Vdc, $I_C$ = 50 mAdc, $f$ = 100 Mhz $V_{CE}$SAT(max.) = 1.2 Vdc at $I_C$ = 1.0 adc with a forced $h_{FE}$ of 10

Turn-on time = 50 nanoseconds, typical

Turn-off time = 70 nanoseconds, typical

The wafers were irradiated in plastic containers in a nuclear reactor and radiation exposure was determined with sulfur pellets and thermoluminescent (TLD) units taped to each container. Test samples were arranged in two vertical columns of three containers and attached to foam blocks. Some wafers which were exposed were placed in vials and irradiated individually.

The discrete transistors were irradiated, mounted on rigid foam blocks placed in circular proximity to the reactor core. Dosimetry was obtained using sulfur pellets and TLD units. The discrete devices were characterized with a Fairchild 500A transistor tester after irradiation.

Three silicon transistor wafers of the above type were selected at random. A total of 100 dice were probed on each wafer, 10 in sequence in each column and every alternate row about the center of the wafer. The electrical probe measurements were made with a Motorola probe station and were $h_{FE}$ at 10 and 100 mAdc collector current and a 1.0 Vdc collector-emitter voltage. The gold backing on the wafers was lapped away after the pre-irradiation electrical probe test. The lapped wafers were scribed and broken into halves, and five of the halves were irradiated. One half wafer was maintained as a control sample. The results obtained on one of the half-wafers are given below.

The electrically probed half-wafer was exposed to a neutron fluence of $\phi_1 = 7.85 \times 10^{13}\ n/cm^2$ (E $\geqslant$ 10 Kev). After the half-wafer was electrically probed and annealed at 250° C for 16 hours, it was again irradiated to a fluence of $\phi_2 = 8.85 \times 10^{13}\ n/cm^2$ (E $\geqslant$ 10 Kev). The half-wafer was again electrically probed, scribed, and broken into chips and assembled as discrete transistors, using commercially available TO-5 transistor headers. Leads were attached, and each device was hermetically sealed. Radiation damage annealing was accomplished by the elevated temperatures of conventional device assembly and by a temperature bake of 250° C for four hours. The experimental results obtained are shown in Tables I and II.

TABLE I

| | Device in Wafer Form | | | Discrete Devices |
|---|---|---|---|---|
| Beta Limits | Initial | $\phi_1$= 7.85 × $10^{13}$n/cm² (E ≥ 10 Kev) 25,000 rads | $\phi_2$= 8.86 × $10^{13}$ n/cm₂ (E ≥ 10Kev) 30,500rads | Conventional Assembly 250°C 4 Hour Temperature Bake |
| Min | 55 | 13 | 13 | 59 |
| Max | 95 | 17 | 17 | 86 |

TABLE II

Beta

| Initial | $\phi_1$=7.85×$10^{13}$n/cm² (E ≥ 10 Kev) 25,000 rads | $\phi_2$=8.86×$10^{13}$ n/cm² (E ≥ 10 Kev) 30,500 rads |
|---|---|---|
| 80 | 16 | 15 |
| 67 | 14 | 15 |
| 67 | 14 | 15 |
| 55 | 14 | 15 |
| 80 | 14 | 15 |
| 70 | 14 | 16 |
| 90 | 14 | 16 |
| 95 | 14 | 17 |
| 95 | 15 | 17 |
| 60 | 15 | 16 |
| 67 | 13 | 15 |
| 60 | 14 | 15 |
| 67 | 13 | 14 |
| 67 | 17 | 15 |
| 80 | 17 | 13 |
| 70 | 15 | 14 |
| 60 | 14 | 14 |
| 95 | 14 | 15 |
| 95 | 14 | 17 |
| 80 | 14 | 17 |
| 70 | 15 | 17 |
| 70 | 17 | 16 |
| 70 | 17 | 17 |
| 95 | 14 | 17 |
| 90 | 15 | 17 |
| 95 | 17 | 16 |
| 95 | 17 | 17 |
| 80 | 17 | 17 |
| 90 | 17 | 17 |
| 80 | 16 | 17 |
| 80 | 17 | 17 |

The procedural steps employed above are summarized schematically below:

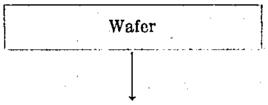

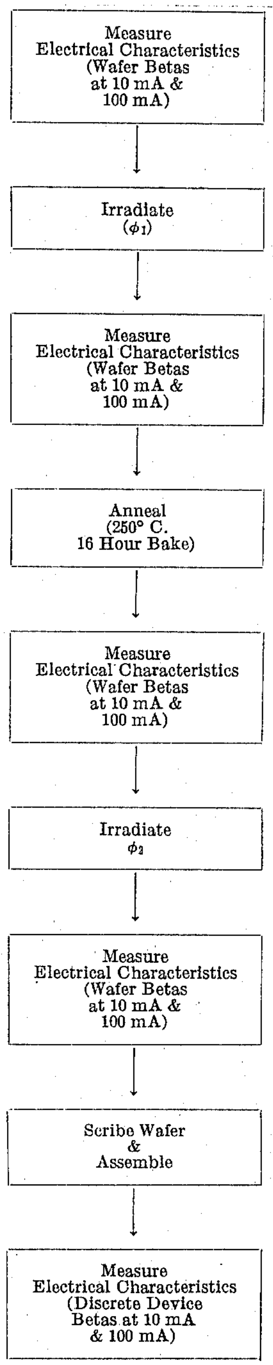

Three gold-backed wafers (A, B, and C) of the type 2N2949were randomly selected and electrically probed. After irradiation to a maximum neutron fluence of 5.78 × $10^{13}$ $n/cm^2$ (E ≥ 10Kev), the wafers were scribed and broken into individual (discrete) dice. While maintaining serialization, sample dice were electrically characterized and the data recorded to determine current gains at 10 mA and 100 mAdc collector current and a 1.0 Vdc collector-emitter voltage. A Tektronix Model 575 curve tracer was used to perform the electrical measurements.

The irradiated dice were then subjected to conventional device processing, including a 4 hour 300° C temperature anneal. After room-temperature dc electrical parameters were read and recorded, packaged transistors were subsequently re-exposed to approximately the same neutron fluences as obtained in the wafer form. The results obtained are tabulated in Table III, which shows the correlation of packaged transistor dice degradation to wafer dice degradation.

Power step stress tests were performed on sample discrete transistors from non-irradiated, and irradiated (wafer form) test samples. These tests were performed to observe variations (if any) of reliability failure modes, mechanisms and levels of the different test samples.

Two half-wafers (non-gold backed) were irradiated three times to a fluence of 2 × $10^{14}$ nvt in each exposure. The wafers were annealed at 300° C for four hours between each exposure. There was no electrical probing between reactor exposures. After the last irradiation, the half-wafers were mounted on TO-5 headers. Internal leads were bonded to the transistors and the devices hermetically sealed.

Four groups of 50 transistors each were serialized and subjected to accelerated power-stress tests. These four groups contained transistors from wafer No. 1 control (1b), wafer No. 1 irradiated (1*a*), wafer No. 2 control (2*b*), and wafer No. 2 irradiated (2*a*). The devices were checked for the following electrical parameter at each readout.

$h_{FE1}$ $V_{CE}$ = 1 volt, $I_C$ = 10 mAdc (min. acceptable = 30)

$h_{FE2}$ $V_{CE}$ = 1 volt, $I_C$ = 100 mAdc (min. acceptable = 35)

$h_{CES}$ $I_C$ = 1 Amp, $I_B$ = 100 mAdc (max. = 1.2 volts)

$V_{BES}$ $I_c$ = 1 Amp, $I_B$ = 100 mAdc (max. = 1.6 volts)

TABLE III

| Device Number | Wafer betas after irradiation | | Betas after package processing | | Betas of packaged devices after irradiation | |
|---|---|---|---|---|---|---|
| | $\phi_1$=4.92×$10^{13}$ n./cm.$^2$ (E≥10 Kev.); 11,700 rads | | | | $\phi_2$=4.85×$10^{13}$ n./cm.$^2$ (E≥10 Kev.) 12,000 rads | |
| | 10 mA. | 100 mA. | | | 10 mA. | 100 mA. |
| 52A[1] | 8 | 13 | | | 11.5 | 18.1 |
| 53A | 9 | 12 | | | 16.3 | 24.7 |
| 54A | 9 | 14 | | | 10.0 | 16.4 |
| 55A | 8 | 14 | | | 12.1 | 18.8 |
| 56A | 8 | 13 | | | 10.7 | 17.8 |
| 57A | 8 | 13 | | | 11.7 | 19.2 |
| 58A | 8 | 14 | | | 17.1 | 26.9 |
| | $\phi$=5.78×$10^{13}$ n./cm.$^2$ (E≥10 Kev.) 12,650 rads | | | | $\phi$=5.45×$10^{13}$ n./cm.$^2$ (E≥10 Kev.) 13,750 rads | |
| 62B | 21 | 37 | 58.0 | 86.8 | 22.1 | 38.1 |
| 63B | 21 | 36 | 64.9 | 96.3 | 24.9 | 43.2 |
| 64B | 22 | 38 | 58.7 | 87.9 | 24.1 | 41.5 |
| 65B | 24 | 40 | 69.1 | 98.3 | 25.1 | 42.7 |
| 66B | 23 | 39 | 61.8 | 93.1 | 30.4 | 51.7 |
| 67B | 23 | 40 | 57.9 | 88.3 | 24.0 | 41.5 |
| 68B | 22 | 38 | 54.1 | 78.5 | 27.7 | 45.4 |
| | $\phi$=5.78×$10^{13}$ n./cm.$^2$ (E≥10 Kev.) 12,650 rads | | | | $\phi$=5.00×$10^{13}$ n./cm.$^2$ (E≥10 Kev.) 12,800 rads | |
| 63C | 12 | 21 | | | 16.9 | 29.0 |
| 64C | 12 | 22 | | | 18.2 | 31.2 |
| 65C | 12 | 21 | | | 19.1 | 32.0 |
| 66C | 13 | 22 | | | 19.4 | 34.0 |
| 67C | 12 | 20 | | | 19.3 | 32.2 |
| 68C | 13 | 22 | | | 20.2 | 34.3 |
| 69C | 12 | 20 | | | 21.6 | 36.6 |

[1] A, B, C, designate three different wafers

The power stress tests were performed as follows:

Step 1 Pd = 1.25 watts $V_{CE}$ = 12.5 volts, $I_C$ = 100 mAdc

TA = 25° C, time = 16 hours

Results: 0 failures

Step 2 Pd = 1.5 watts $V_{CE}$ = 15 volts, $I_C$ = 100 mAdc
TA = 25° C, time = 16 hours
Results: 1 failure (short)
1 device, wafer No. 2 irradiated group
Step 3 Pd = 1.75 watts
$V_{CE}$ = 17.5 volts, $I_C$ = 100 mAdc
TA = 25° C, time = 16 hours
Results: 0 failures
Step 4 Pd = 2.0 watts
$V_{CE}$ = 20 volts, $I_C$ = 100 mAdc
TA = 25° C, time = 16 hours
Results: 4 failures (short)
2 devices, wafer No. 1 control group
1 device, wafer No. 2 irradiated group
1 device, water No. 2 control group
Step 5 Pd = 2.0 watts
$V_{CE}$ = 20 volts, $I_C$ = 100 mAdc
TA = 25° C, time = 48 hours
Results: 2 failures (shorts)
2 devices, wafer No. 1 irradiated group
Step 6 Pd = 2.0 watts
$V_{CE}$ = 20 volts, $I_C$ = 100 mAdc
TA = 25° C, time=436 hours
Results: 5 failures (shorts)
1 device, wafer No. 1 control group
1 device, wafer No. 1 irradiated group
3 devices, wafer No. 2 control group
Step 7 Pd = 2.0 watts
$V_{CE}$ = 20 volts, $I_C$ = 100 mAdc
TA = 25° C, time = 500 hours
Results: 1 failure (short)
1 device, wafer No. 2 irradiated group The number of catastrophic failures in each group is nearly the same (three in each group, except four in the control group of wafer No. 2). These results demonstrated that the number of catastrophic failures is not significantly increased by neutron exposure. The devices were stressed at a factor of 2.0 times rated power for over 1,000 hours with comparatively few failures in any group.

Power stress testing was also performed on transistors from a wafer that had one half of the wafer irradiated to a fluence of $8.86 \times 10^{13}$ $n/cm^2$. 50 samples from each half of the wafer were packaged in TO = 5 cans and subjected to a constant stress operating life test at 2 watts for 1,000 hours (two times rated power). There were no catastrophic or serious degradation failures observed in the samples.

These results show that the current gains of transistors, which have been annealed, will be reduced to almost the same values upon successive irradiation to the same fluence and that the values of transistor current gain will be almost the same as the initial gain after successive irradiation and annealing cycles.

Power stress-to-failure tests results have shown that packaged devices constructed from irradiated and annealed wafers have the same failure modes as packaged devices constructed from non-irradiated wafers. There were no apparent changes in the modes of failure of these high-reliability transistors.

What is claimed is:

1. A process for preparing nuclear hard semiconductor or microelectronic devices comprising:

1. determining the electrical characteristics of said devices,
2. subjecting said devices having acceptable electrical characteristics to neutron radiation,
3. determining the electrical characteristic of said irradiated devices,
4. annealing said devices having acceptable electrical characteristics at a temperature ranging from about 225° C to about 700° C.

2. The process of claim 1 wherein said semiconductor is silicon, germanium or gallium arsenide.

3. The process of claim 1 wherein said annealing is at a temperature of from about 400° C to about 550° C.

4. The process of claim 1 wherein said device is annealed more than once.

5. A process for preparing nuclear hard semiconductor comprising:

1. determining the electrical characteristics of the individual dice of said semiconductor,
2. marking the individual dice of said semiconductor having unacceptable electrical characteristics,
3. subjecting said semiconductor to neutron radiation
4. determining the electrical characteristics of the individual dice of said irradiated semiconductor
5. marking the individual dice of said semiconductor having unacceptable electrical characteristics, and
6. annealing the individual dice of said semiconductor having acceptable electrical characteristics at a temperature ranging from about 225° C to about 700° C.

* * * * *